US012803582B2

(12) United States Patent
Subramanian et al.

(10) Patent No.: US 12,803,582 B2
(45) Date of Patent: Nov. 17, 2026

(54) CTDSM WITH HIGH TOLERANCE TO CLOCK FREQUENCY VARIATION

(71) Applicant: TEXAS INSTRUMENTS INCORPORATED, Dallas, TX (US)

(72) Inventors: Anand Subramanian, Dallas, TX (US); Tanmay Halder, Bangalore (IN); Anand Kannan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 134 days.

(21) Appl. No.: 18/986,402

(22) Filed: Dec. 18, 2024

(65) Prior Publication Data

US 2026/0172047 A1 Jun. 18, 2026

(51) Int. Cl.

| | |
|---|---|
| ***H03M 3/00*** | (2006.01) |
| ***H03H 17/00*** | (2006.01) |
| ***H04R 3/04*** | (2006.01) |

(52) U.S. Cl.

CPC ................ *H03M 3/50* (2013.01); *H04R 3/04* (2013.01); *H03H 2017/0081* (2013.01)

(58) Field of Classification Search

CPC .... H03M 3/50; H04R 3/04; H03H 2017/0081
See application file for complete search history.

(56) References Cited

U.S. PATENT DOCUMENTS

| | | | | |
|---|---|---|---|---|
| 6,087,969 | A * | 7/2000 | Stockstad | H03M 3/394 341/143 |
| 7,129,873 | B2 * | 10/2006 | Kawamura | H03M 7/3015 341/143 |
| 2012/0075132 | A1 * | 3/2012 | Lai | H03M 3/38 341/143 |

FOREIGN PATENT DOCUMENTS

| | | | | |
|---|---|---|---|---|
| KR | 102968901 | B1 * | 5/2026 | H03M 3/504 |

* cited by examiner

*Primary Examiner* — Devona E Faulk

(74) *Attorney, Agent, or Firm* — Xianghui Huang; Charles F. Koch

(57) ABSTRACT

A device includes a loop filter and an integrator. An integrator input couples to a loop filter output. The device includes a quantizer. A quantizer input couples to an integrator output. The device includes a finite impulse response (FIR) filter, with a FIR filter input coupled to a quantizer output, and a FIR filter output coupled to a loop filter input. The device includes first error correction circuitry (FECC), with a FECC input coupled to the quantizer output, and a FECC output coupled to the quantizer input. The FECC includes a first filter having a first number of taps. The device includes second error correction circuitry (SECC), with a SECC input coupled to the quantizer output, and a SECC output coupled to the integrator input. The SECC includes a second filter having a second number of taps greater than the first number of taps.

20 Claims, 10 Drawing Sheets

700

800

900

CTDSM WITH HIGH TOLERANCE TO CLOCK FREQUENCY VARIATION

CROSS-REFERENCE TO RELATED APPLICATIONS

The present application relates to India Provisional Patent Application No. 202341048895, which was filed Jul. 20, 2023, and is hereby incorporated herein by reference in its entirety.

BACKGROUND

Continuous-time delta-sigma modulators (CTDSMs) are circuits used in signal processing to convert analog signals into digital format. They operate by sampling an analog input continuously and using a feedback loop to shape the quantization noise, allowing for a higher resolution within a specified frequency band. These modulators may include an integrator, a quantizer, and a feedback system. The continuous-time design enables reduced power consumption and can simplify the anti-aliasing demands compared to discrete-time modulators. Continuous-time delta-sigma modulators are used in a range of applications, especially where high precision and efficient signal conversion are useful.

SUMMARY

A device includes a loop filter and an integrator. An integrator input couples to a loop filter output. The device includes a quantizer. A quantizer input couples to an integrator output. The device includes a finite impulse response (FIR) filter, with a FIR filter input coupled to a quantizer output, and a FIR filter output coupled to a loop filter input. The device includes first error correction circuitry (FECC), with a FECC input coupled to the quantizer output, and a FECC output coupled to the quantizer input. The FECC includes a first filter having a first number of taps. The device includes second error correction circuitry (SECC), with a SECC input coupled to the quantizer output, and a SECC output coupled to the integrator input. The SECC includes a second filter having a second number of taps greater than the first number of taps.

DETAILED DESCRIPTION

Figure 1:
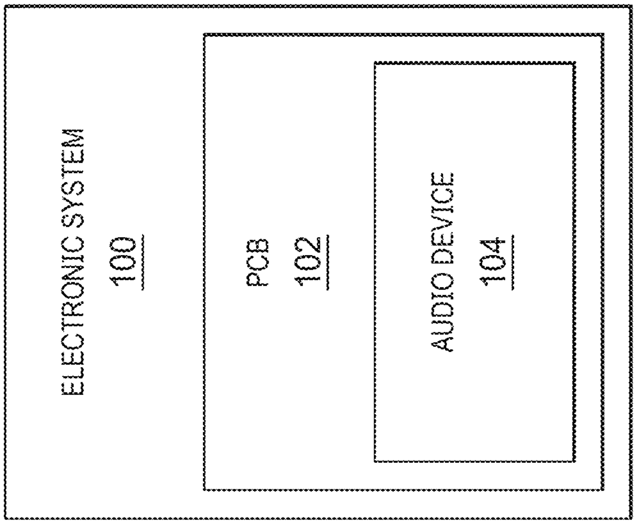
FIG. 1 is a block diagram of an electronic system including an audio device having a CTDSM with a high tolerance to clock frequency variation, in various examples.

Clock jitter, or timing uncertainty, causes variations in sampling times, which can introduce errors in continuous-time systems. In a CTDSM, this jitter affects the timing of the quantization process, potentially distorting the signal, especially at high frequencies where timing errors are more pronounced.

A finite impulse response (FIR) filter is a filter having an impulse response that is of finite duration, because the FIR filter lacks internal feedback. Because the output of the FIR filter does not depend on prior outputs or internal feedback, the FIR filter provides a stable impulse response. This characteristic helps reduce the dependence of the CTDSM on precise timing, as the fixed, finite response of the FIR filter mitigates the timing errors introduced by jitter. Because the FIR filter operates on a pre-determined set of coefficients applied to a sequence of samples, the FIR filter effectively averages out small variations in timing, which reduces the sensitivity of the CTDSM to clock jitter.

FIR filters attenuate high-frequency noise by having a limited impulse response duration and specific frequency-response characteristics. The FIR filter coefficients may be selected to suppress high-frequency components outside the signal band of interest. In a CTDSM, high-frequency quantization noise is shaped and pushed out of the signal band, but that noise still exists in the output frequency spectrum. A FIR filter may further attenuate this high-frequency noise by having a controlled frequency response. This effect is particularly beneficial in delta-sigma modulators, where the goal is to minimize noise within the desired signal band.

A FIR filter may be included in the feedback loop of a CTDSM. While the FIR filter provides the advantages described above, the FIR filter includes multiple delay blocks, which collectively operate to delay the feedback signal of the CTDSM. Consequently, the feedback signal of the CTDSM is phase-shifted relative to the input signal to the CTDSM. Stated another way, the FIR filter causes the phases of the feedback signal of the CTDSM and the input signal of the CTDSM to become misaligned. This results in CTDSM error. Other solutions to mitigate this error significantly limit the swings in clock frequency or period that the CTDSM can tolerate. Solutions to mitigate the diminished tolerance to clock frequency variation use large, expensive hardware (e.g., large, expensive, high-accuracy digital-to-analog converters (DACs)).

This description presents various examples of a CTDSM that have a high tolerance to clock frequency variation. Specifically, example CTDSMs include a FIR filter and thus provide the advantages of a FIR filter. However, the CTDSMs further include circuitry that enables the CTDSM to tolerate wide swings in clock frequency (or period) without having a commensurate increase in hardware size or costs (e.g., without including large, expensive, high-accuracy DACs). In examples, a CTDSM includes an integrator having an input and an output and a quantizer having an input and an output. The input of the quantizer is coupled to the output of the integrator. The CTDSM includes a first filter having one or more taps, an input, and an output. The input of the first filter is coupled to the output of the quantizer. The CTDSM includes a first digital-to-analog converter (DAC) having an input and an output. The input of the first DAC is coupled to the output of the first filter, and the output of the first DAC is coupled to the input of the quantizer. The CTDSM includes a second filter having one or more taps, an input, and an output, with the input of the second filter coupled to the output of the quantizer. The CTDSM includes a second DAC having an input and an output. The input of the second DAC is coupled to the output of the second filter, and the output of the second DAC is coupled to the input of the integrator. The CTDSM includes a third filter having an input coupled to the output of the quantizer. Because the output of the second filter is coupled to the second DAC and the output of the second DAC is coupled to the input of the integrator, and further because the integrator operates according to the clock frequency, the error correction provided by the second filter scales with the gain of the CTDSM, providing an error correction advantage over CTDSMs lacking such scaling ability. Further, the number of taps in the first filter is greater than a number of taps in the second filter. Consequently, the number and/or size of DACs associated with the second filter is controlled, resulting in substantial reductions in cost and space usage relative to the costs and space usage that would otherwise be incurred.

FIG. 1 is a block diagram of an electronic system including an audio device having a CTDSM with a high tolerance to clock frequency variation, in various examples. Examples of the CTDSM are described by reference to FIGS. 3, 4, 5A, and 5B. Specifically, FIG. 1 is a block diagram of an electronic system 100 that may include a printed circuit board (PCB) 102 and an audio device 104 coupled to the PCB 102. Examples of the electronic system 100 include an automobile, an aircraft, a watercraft, a spacecraft, a video game console, a smartphone, an entertainment device, a stereo system, an appliance, a laptop computer, a desktop computer, a tablet, a notebook, or any other suitable type of electronic device or system. In examples, the electronic system 100 is any device or system in which an analog-to-digital converter (ADC) is present or would be useful. The audio device 104 may be any suitable audio subsystem, device, circuitry, or executable instructions that result in the production of sound, such as an audio system in a laptop computer or an automobile. Other examples of the electronic system 100 and the audio device 104 are contemplated and included in the scope of this disclosure.

Figure 2:
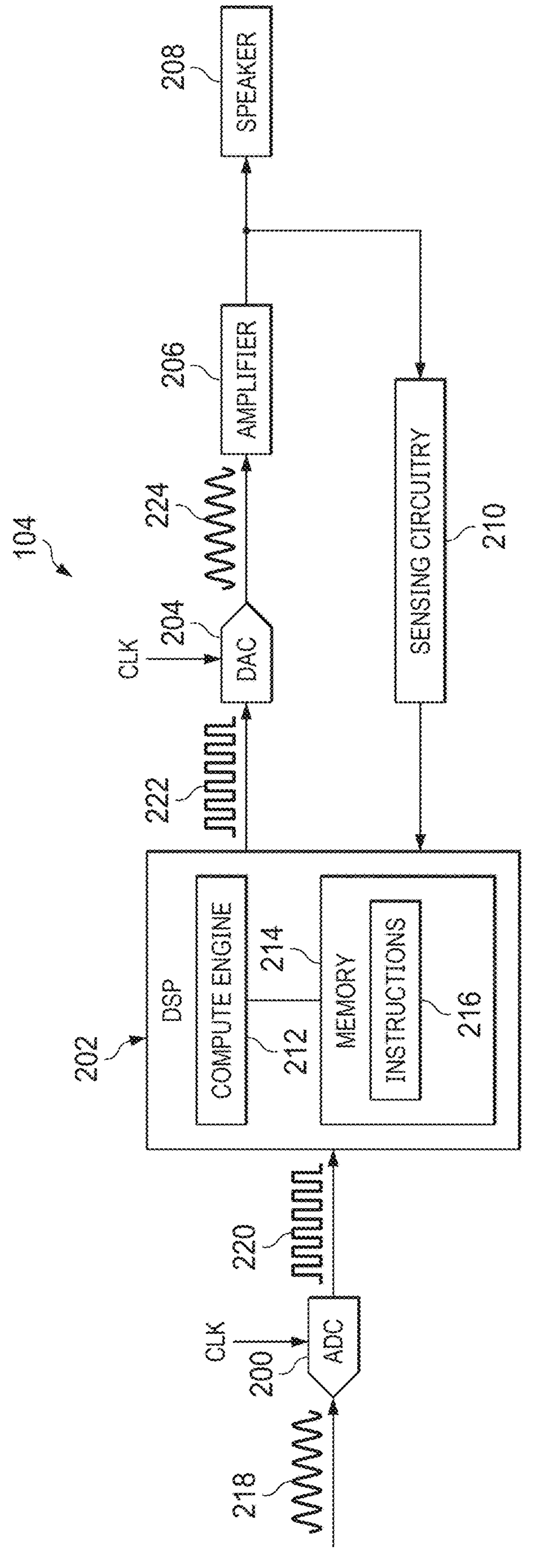
FIG. 2 is a block diagram of an audio device having a CTDSM with a high tolerance to clock frequency variation, in various examples.

FIG. 2 is a block diagram of an audio device having a CTDSM with a high tolerance to clock frequency variation, in various examples. Specifically, FIG. 2 depicts an example of the audio device 104. The example audio device 104 includes an ADC 200, a digital signal processor (DSP) 202, a DAC 204, an amplifier 206, a speaker 208, and sensing circuitry 210. The ADC 200 includes an input that may receive analog signals and an output coupled to an input of the DSP 202. The ADC 200 also includes a clock input. An output of the DSP 202 is coupled to an input of the DAC 204. An output of the DAC 204 is coupled to an input of the amplifier 206. An output of the amplifier 206 is coupled to an input of the speaker 208. The output of the amplifier 206 is also coupled to an input of the sensing circuitry 210. An output of the sensing circuitry 210 is coupled to an input of the DSP 202.

The DSP 202 includes a compute engine 212 and a memory 214 coupled to the compute engine 212. The memory 214 stores executable instructions 216 that may be executed by the compute engine 212 to perform some or all of the various operations attributed herein to the DSP 202.

In an example operation, the ADC 200 receives an analog signal 218. The analog signal 218 may be received from any suitable source. The ADC 200 uses the clock signal CLK to convert the analog signal 218 to a digital signal 220. The DSP 202 receives the digital signal 220 from the ADC 200 and processes the digital signal 220 in any suitable manner (e.g., according to the executable instructions 216). The DSP 202 provides a processed digital signal 222 on an output of the DSP 202. The DAC 204 receives the processed digital signal 222 and converts the processed digital signal 222 to a processed analog signal 224 using CLK. The amplifier 206 applies a gain to the processed analog signal 224 and provides an amplified signal to the speaker 208. The speaker 208 produces audible sound responsive to receiving the amplified signal from the amplifier 206. The sensing circuitry 210 also receives the amplified signal from the amplifier 206. The sensing circuitry 210 senses different parameters of the amplified signal, such as voltage and/or current at the input to the speaker 208. The sensing circuitry 210 provides such sensed parameters to the DSP 202 for any of a variety of purposes.

ADCs frequently include delta sigma modulators (DSMs) to facilitate the conversion of signals from analog domain to digital domain. For example, the ADC 200 includes a CTDSM. More specifically, the ADC 200 includes a CTDSM with a high tolerance to clock frequency variation, consistent with the various example CTDSMs described herein in subsequent figures.

Figure 3:
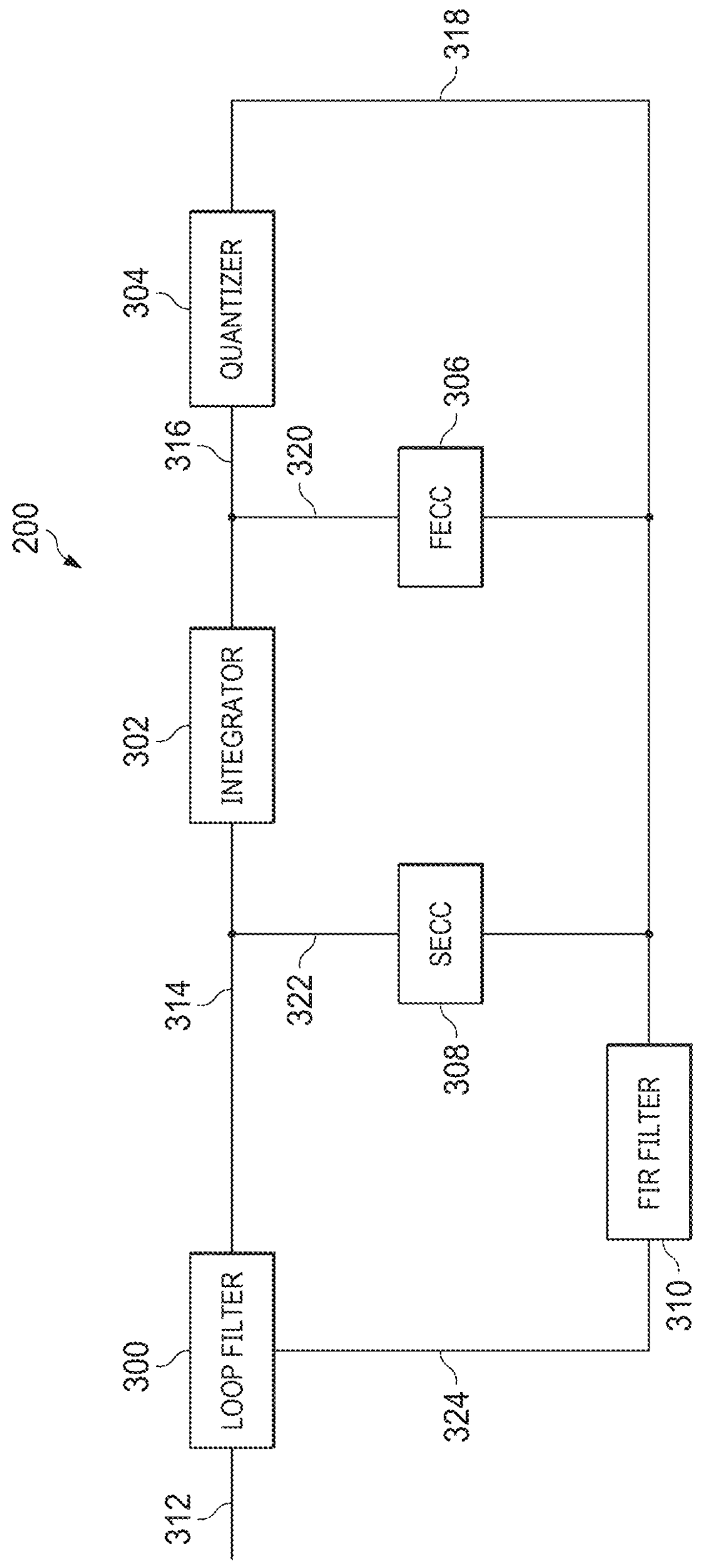
FIG. 3 is a circuit schematic block diagram of a CTDSM with a high tolerance to clock frequency variation, in various examples.

For example, FIG. 3 is a circuit schematic block diagram of an example CTDSM with a high tolerance to clock frequency variation, such as may be included in the ADC 200. Although the components shown in FIG. 3 are labeled with a numeral 200 to indicate the ADC 200, the ADC 200 may include additional components beyond those expressly shown in FIG. 3. In examples, the ADC 200 includes a loop filter 300, an integrator 302, a quantizer 304, first error correction circuitry (FECC) 306, second error correction circuitry (SECC) 308, and a FIR filter 310.

In examples, the loop filter 300 includes various types and configurations of components suitable to implement the operations of a loop filter, such as integrators, combination blocks, and DACs. Examples of the FECC 306 include various types and configurations of components suitable to implement the operations attributed herein to the FECC 306. Similarly, the examples of SECC 308 include various types and configurations of components suitable to implement the operations attributed herein to the SECC 308.

In some examples, the integrator 302 is considered to be part of the loop filter 300. In other examples, the integrator 302 is considered to be separate from the loop filter 300.

A connection 312 is coupled to an input of the loop filter 300. A connection 314 couples an output of the loop filter 300 to an input of the integrator 302. A connection 316 couples an output of the integrator 302 to an input of a quantizer 304. A connection 318 couples an output of the quantizer 304 to an input of the FECC 306, an input of the SECC 308, and an input of the FIR filter 310. A connection 320 couples an output of the FECC 306 to the connection 316. A connection 322 couples an output of the SECC 308 to the connection 314. A connection 324 couples an output of the FIR filter 310 to the connection 312.

In operation, the example CTDSM of FIG. 3, and more specifically, the loop filter 300, receives an analog input signal on the connection 312. The connection 312 is an example of the input that receives the analog signal 218 in FIG. 2. Accordingly, the analog signal on the connection 312 is representative of analog signal 218 in FIG. 2. The loop filter 300 also receives feedback signals via the connection 324. The loop filter 300 shapes quantization noise by filtering and integrating the input and feedback signals of the CTDSM to provide high-resolution signal conversion within a target frequency band. The loop filter 300 provides an output signal to the integrator 302 via the connection 314. The integrator 302 integrates the output signal from the loop filter 300 and provides an output signal to quantizer 304. The quantizer 304 quantizes the analog signal received via the connection 316 and converts the signal to a digital signal on the connection 318. The connection 318 is representative of the output on which signal 220 is provided (FIG. 2). The FIR filter 310 receives the digital signal from the quantizer 304 via the connection 318 and applies to the signal a specific discrete-time impulse response to enhance noise shaping and CTDSM stability. The FIR filter 310 provides an output signal on the connection 324, which is also referred to herein as the feedback signal of the CTDSM. The loop filter 300 includes a DAC that converts the feedback signal from the FIR filter 310 to an analog signal, which is combined with the input signal to the CTDSM on the connection 312. The remainder of the loop filter 300 subsequently processes the combined analog signal, as described in detail below.

The FIR filter 310 may impart to the CTDSM the specific benefits described in detail above. However, the FIR filter 310 may also add delay to the signal, meaning that the signal provided by the FIR filter 310 to the connection 324 is phase-shifted, and more specifically phase-delayed, with respect to the input signal that is provided to the CTDSM on the connection 312. Because of this phase mismatch, the loop filter 300 may become unstable and introduce error to the output of the loop filter 300. The FECC 306 operates to correct the error produced by this phase mismatch, specifically filtering the digital signal provided on the connection 318 according to preset weighted taps in the FECC 306, converting the resulting digital signal to the analog domain by a DAC, and providing the resulting analog signal to the connection 316 to be combined with the output signal from the integrator 302. The weights of the filter taps in the FECC 306 are selected according to specific criteria, described in detail below.

In certain circumstances, the FECC 306 may be sufficient to correct the phase shift error introduced by the loop filter 300 due to the phase shift introduced by the FIR filter 310. If the frequency of the clock signal (which may be referred to herein as CLK) provided to the loop filter 300 increases, the integrators within the loop filter 300 spend more time integrating incoming signals, which effectively imparts a gain of varying degrees to the incoming signals. (Because CLK period is the inverse of CLK frequency, references to frequency also encompass period, and references to period also encompass frequency.) The FECC 306, however, provides an output signal on the connection 316, which is downstream of the loop filter 300 and the integrator 302. As a result, the FECC 306 is independent of changes to CLK frequency, meaning that the error correction provided by the FECC 306 may not be able to match gains applied by the loop filter 300 as a result of changes to CLK frequency. For example, a significant decrease in CLK frequency can substantially increase the gain applied by the loop filter 300, also amplifying the error. The FECC 306, however, is not impacted by such changes in CLK frequency, and thus the error correction provided by the FECC 306 becomes negligible vis-à-vis the error applied by the loop filter 300 as a result of the above-described phase-shift.

The SECC 308 mitigates this concern. Specifically, the SECC 308 includes a filter having taps specifically weighted to mitigate error introduced by the phase-shift described above. Because the output of the SECC 308 couples to the connection 322, which couples to the connection 314 upstream of the integrator 302, the output of the SECC 308 is affected by the integrator 302. Thus, changes in CLK frequency, which affect the integrator 302, also affect the output signal provided by the SECC 308. For example, a substantial decrease in CLK frequency may cause the gain imparted by the loop filter 300 to rise significantly. Because the FECC 306 is independent of the CLK frequency, the error correction provided by the FECC 306 does not scale with the increase in gain of the loop filter 300. However, because the output of the SECC 308 is provided to the integrator 302, the output of the SECC 308 is affected by the CLK frequency, and thus the error correction provided by the SECC 308 scales with the increase in gain of the loop filter 300. The SECC 308 thus significantly expands the CLK frequency variation tolerance of the CTDSM.

As described, the error-correcting output signal of the SECC 308 may experience significant gain, particularly when CLK frequency is reduced and the integrator 302 spends larger amounts of time integrating the signal present on the connection 314. Accordingly, the DAC within the SECC 308, which converts the error-correcting output signal of the SECC 308 to the analog domain prior to combination with the analog signal at the connection 314, is a high-accuracy DAC. If the DAC of the SECC 308 is a low-accuracy DAC, these inaccuracies may be provided to the integrator 302, which may amplify the inaccuracies. Consequently, the error correction provided by the SECC 308 may be nullified, or worse, the SECC 308 may result in a net increase in error. However, high-accuracy DACs are expensive and occupy significant space. Thus, the degree of error correction provided by the SECC 308 is minimized, such as by minimizing the number and weights of taps in the SECC 308 filter. For instance, the number and weights of the taps in the FECC 306 may be selected to perform as much of the error correction as possible and the number and weights of the taps in the SECC 308 may be selected to perform as little of the error correction as possible, while still respecting expected CLK frequency variation tolerance demands of the CTDSM. Fewer taps in the SECC 308 results in decreased accuracy demands for the DAC of the SECC 308, which, in turn, results in reduced costs and space consumption.

Figure 4:
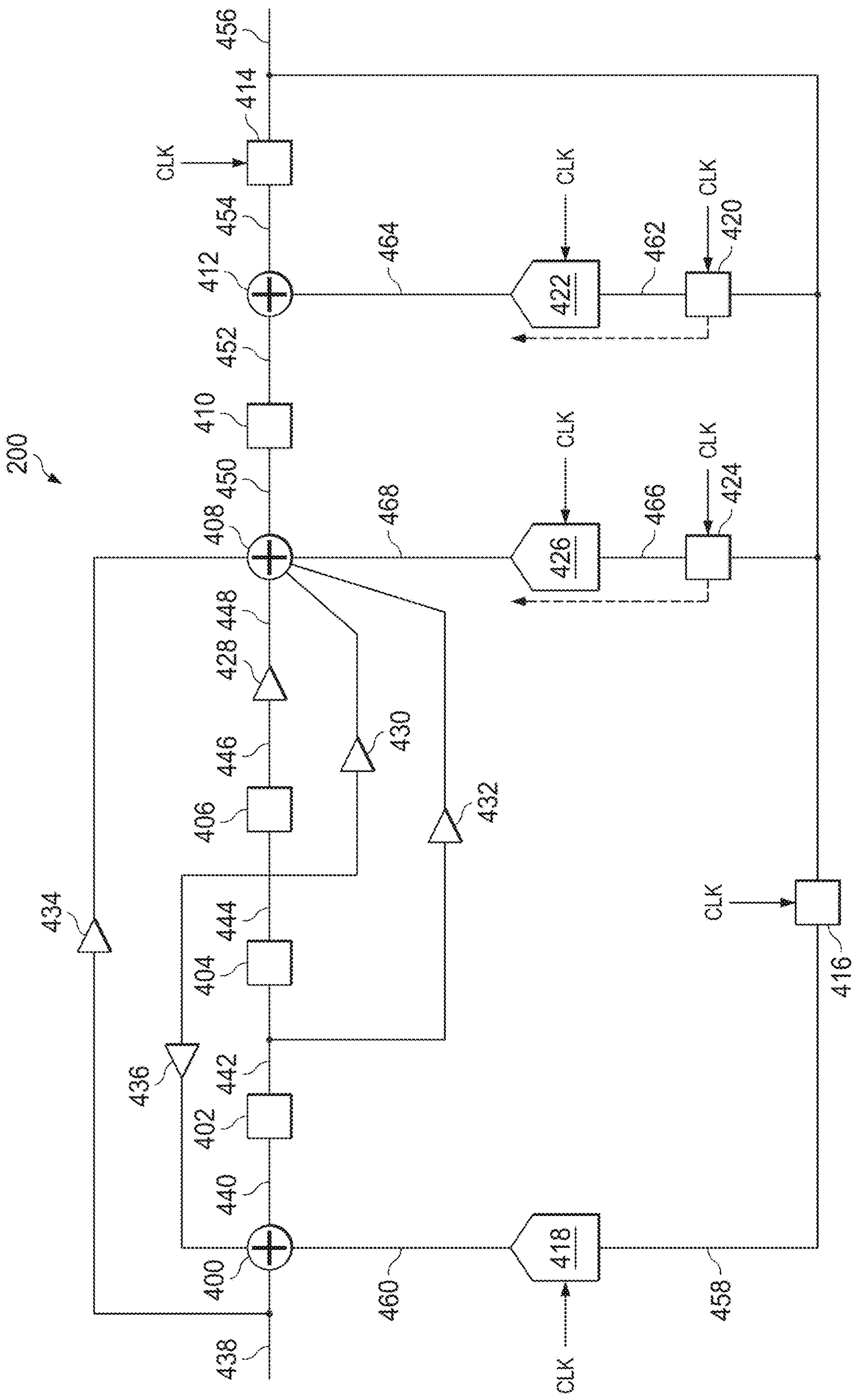
FIG. 4 is a circuit schematic diagram of a CTDSM with a high tolerance to clock frequency variation, in various examples.

FIG. 4 is a circuit schematic diagram of an example CTDSM with a high tolerance to clock frequency variation, such as may be included in the ADC 200. The circuit schematic diagram of FIG. 4 is representative of the CTDSM in FIG. 3. The example CTDSM of FIG. 4 includes a combination block 400, an integrator 402, an integrator 404, an integrator 406, a combination block 408, an integrator 410, a combination block 412, a quantizer 414, a FIR filter 416, a DAC 418 (e.g., a most-significant-bit (MSB) DAC), a multi-tap filter 420 (e.g., a FIR filter, a comb filter), a DAC 422, a multi-tap filter 424 (e.g., a FIR filter, a comb filter), and a DAC 426. The example CTDSM of FIG. 4 also includes weighting components 428, 430, 432, 434, and 436 (e.g., resistors, amplifiers, or any other suitable circuit component(s) that can apply a weight to a received signal, for example, by adjusting the amplitude of that signal).

The combination block 400, the integrators 402, 404, and 406, the combination block 408, the DAC 418, and the weighting components 428, 430, 432, 434, and 436 may form an example of the loop filter 300 (FIG. 3). The integrator 410 may be an example of the integrator 302 (FIG. 3). The quantizer 414 may be an example of the quantizer 304 (FIG. 3). The multi-tap filter 420 and the DAC 422 may form an example of the FECC 306 (FIG. 3). The multi-tap filter 424 and the DAC 426 may form an example of the SECC 308 (FIG. 3). The FIR filter 416 may be an example of the FIR filter 310 (FIG. 3).

An input 438 is coupled to the combination block 400. A connection 440 couples an output of the combination block 400 to an input of the integrator 402. A connection 442 couples an output of the integrator 402 to an input of the integrator 404. A connection 444 couples an output of the integrator 404 to an input of the integrator 406. A connection 446 couples an output of the integrator 406 to an input of the weighing component 428. A connection 448 couples an output of the weighting component 428 to an input of the combination block 408. A connection 450 couples an output of the combination block 408 to an input of the integrator 410. A connection 452 couples an output of the integrator 410 to an input of the combination block 412. A connection 454 couples an output of the combination block 412 to an input of the quantizer 414. A connection 456 couples an output of the quantizer 414 to an input of the multi-tap filter 420, an input of the multi-tap filter 424, and an input of the FIR filter 416. A connection 458 couples an output of the FIR filter 416 to an input of the DAC 418. A connection 460 couples an output of the DAC 418 to an input of the combination block 400. A connection 462 couples an output of the multi-tap filter 420 to an input of the DAC 422. A connection 464 couples an output of the DAC 422 to an input of the combination block 412. A connection 466 couples an output of the multi-tap filter 424 to an input of the DAC 426. A connection 468 couples an output of the DAC 426 to an input of the combination block 408. The weighting component 430 couples an output of the integrator 404 to an input of the combination block 408. The weighting component 432 couples an output of the integrator 402 to an input of the combination block 408. The weighting component 434 couples the input 438 to the combination block 408. The weighting component 436 couples an output of the integrator 404 to an input of the combination block 400.

Example operation of the CTDSM of FIG. 4 is similar to that of the CTDSM in FIG. 3. An input signal on the input 438 is combined with feedback signals received from the weighting component 436 and the DAC 418. The input signal on the input 438 is provided to the weighting component 434, which applies a weight to the input signal and provides a weighted signal to the combination block 408. The combination block 400 receives the input signal from the input 438, a weighted feedback signal from the weighting component 436, and a feedback signal from the DAC 418, and provides an output signal on connection 440 to the integrator 402. The integrator 402 integrates the received signal and provides an output signal on the connection 442. The weighting component 432 applies a weight to the output signal on the connection 442 and provides the weighted signal to the combination block 408. The integrator 404 integrates the received signal from the connection 442 and provides an output signal on the connection 444. The weighting components 436 and 430 apply weights to the output signal on the connection 444 and provides the respective weighted signals to the combination blocks 400 and 408, respectively. The integrator 406 integrates the output signal on the connection 444 and provides an output signal on the connection 446. The weighting component 428 applies a weight to the output signal on the connection 446 and provides a weighted signal on the connection 448 to the combination block 408.

The combination block 408 receives as input signals the various weighted signals described above and an output signal from the DAC 426. The combination block 408 combines the received input signals and provides an output signal on the connection 450. The integrator 410 integrates the output signal on the connection 450 and provides an integrated signal on the connection 452 to the combination block 412. The combination block combines the signal on the connection 452 with an output signal from the DAC 422 to provide an output signal on the connection 454. The quantizer 414 uses the CLK signal to quantize the output signal on the connection 454 and provide a quantized signal on the connection 456. The FIR filter 416 uses the CLK signal to filter the quantized signal on the connection 456 and provide the filtered signal on the connection 458. The DAC 418 uses the CLK signal to convert the filtered signal on the connection 458 to the analog domain and provide an output signal on the connection 460.

The multi-tap filter 420 filters the quantized signal on the connection 456. The specific filtering operation applied by the multi-tap filter 420 depends on the specific number of taps and the weights applied by those taps to the quantized signal on the connection 456. Any number of taps and weights may be appropriate and may be selected using the approach described above. The multi-tap filter 420 uses the CLK signal to perform filtering operations. The DAC 422 receives the filtered signal via the connection 462 and converts the filtered signal received from the multi-tap filter 420 to the analog domain. The DAC 422 provides the analog output signal to the combination block 412. The multi-tap filter 424 receives the quantized signal on the connection 456 and uses the CLK signal to perform filtering operations. The specific filtering operation applied by the multi-tap filter 424 depends on the specific number of taps and the weights applied by those taps to the quantized signal on the connection 456. Any number of taps and weights may be appropriate and may be selected using the approach described above. The DAC 426 receives the filtered signal via the connection 466 and converts the filtered signal received from the multi-tap filter 424 to the analog domain. The DAC 426 provides the analog output signal to the combination block 408.

As described above, the number of taps in the multi-tap filter 424 is minimized to reduce the expense and space demands for the DAC 426. A relatively large number of taps in the multi-tap filter 424 results in a large, expensive DAC 426, because the error correction provided by the multi-tap filter 424 scales significantly with the CLK frequency in the integrator 410, and thus the DAC 426 may be highly precise. To avoid the use of such expensive, large, high-precision DACs, the number of taps in the multi-tap filter 424 is selected to be as small as possible while respecting expected CLK frequency variation tolerance demands of the CTDSM. In examples, the number of taps in the multi-tap filter 424 is fewer than the number of taps in the multi-tap filter 420.

The multi-tap filter 424 and the DAC 426 provide a coarse error correction to the signal at the combination block 408. The multi-tap filter 420 and the DAC 422 provide a finer error correction to the signal at the combination block 412. Because the error correction provided by the multi-tap filter 424 and the DAC 426 scale with CLK frequency variation, the multi-tap filter 424 and the DAC 426 increase the tolerance of the CTDSM to CLK frequency variations. The multi-tap filter 420 and the DAC 422 enable any error correction not strictly necessary to be performed by the multi-tap filter 424 and DAC 426, thereby mitigating the expense and space demands associated with a large number of taps in the multi-tap filter 424 and the large DAC 426.

Figure 5A:
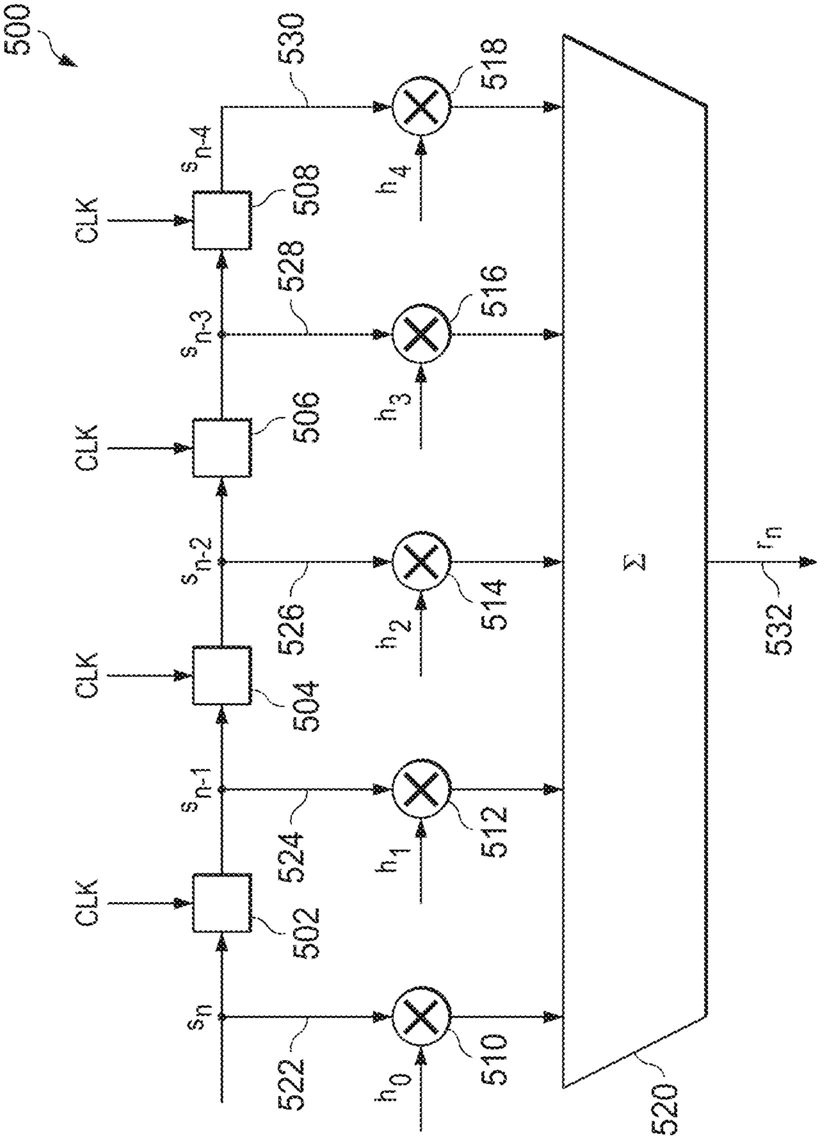
FIGS. 5A and 5B are circuit schematic diagrams of filters of CTDSMs with high tolerances to clock frequency variation, in various examples.

FIG. 5A is a circuit schematic diagram of a filter in a CTDSM with a high tolerance to clock frequency variation, in various examples. More specifically, FIG. 5A is a circuit schematic diagram of a filter 500, such as one or more of the multi-tap filters 420, 424 and/or the FIR filter 416. The example filter 500 includes delay circuits 502, 504, 506, and 508, each of which receives the CLK signal to facilitate delay. For example, the delay circuits 502, 504, 506, and 508 are flip-flops, shift registers, or latches that operate according to the CLK signal. The example filter 500 also includes multiplication blocks 510, 512, 514, 516, and 518. The example filter 500 further includes a combination block 520.

The multiplication blocks 510, 512, 514, 516, and 518 may be considered as "taps," meaning that the example filter 500 is a 5-tap filter. The inputs of the delay circuit 502 and multiplication block 510 are coupled to a connection 522. The output of the delay circuit 502, the input of the delay circuit 504, and the input of the multiplication block 512 are coupled to a connection 524. The output of the delay circuit 504, the input of the delay circuit 506, and the input of the multiplication block 514 are coupled to a connection 526. The output of the delay circuit 506, the input of the delay circuit 508, and the input of the multiplication block 516 are coupled to a connection 528. The output of the delay circuit 508 and the input of the multiplication block 518 are coupled to a connection 530. The outputs of the multiplication blocks 510, 512, 514, 516, and 518 are coupled to the inputs of the combination block 520. The output of the combination block 520 is coupled to a connection 532.

In example operation, the connection 522 receives an input signal $s_n$. The delay circuit 502 delays $s_n$ to provide $s_{n-1}$ on connection 524. The delay circuit 504 delays $s_{n-1}$ to provide $s_{n-2}$ on connection 526. The delay circuit 506 delays $s_{n-2}$ to provide $s_{n-3}$ on connection 528. The delay circuit 508 delays $s_{n-3}$ to provide $s_{n-4}$ on connection 530. The multiplication block 510 multiplies $s_n$ by a coefficient $h_0$ and provides the output of the multiplication to the combination block 520. The multiplication block 512 multiplies $s_{n-1}$ by a coefficient $h_1$ and provides the output of the multiplication to the combination block 520. The multiplication block 514 multiplies $s_{n-2}$ by a coefficient $h_2$ and provides the output of the multiplication to the combination block 520. The multiplication block 516 multiplies $s_{n-3}$ by a coefficient $h_3$ and provides the output of the multiplication to the combination block 520. The multiplication block 518 multiplies $s_{n-4}$ by a coefficient $h_4$ and provides the output of the multiplication to the combination block 520. The combination block 520 combines (e.g., sums) the input signals received from the multiplication blocks 510, 512, 514, 516, and 518 to provide an output signal $r_n$ on the connection 532.

In FIG. 4, the output of the multi-tap filter 424 is coupled to an input of a single DAC 426 by the connection 466. This example assumes that the combination block 520 of the multi-tap filter 424 is a digital combination block, meaning that the combination block 520 performs combination operations with digital signals. In such examples, the single DAC 426 is useful to convert the digital signal provided by the combination block 520 into the analog domain. Reducing the number of taps in the multi-tap filter 424 decreases the accuracy demands on the single DAC 426, as described herein.

Figure 5B:
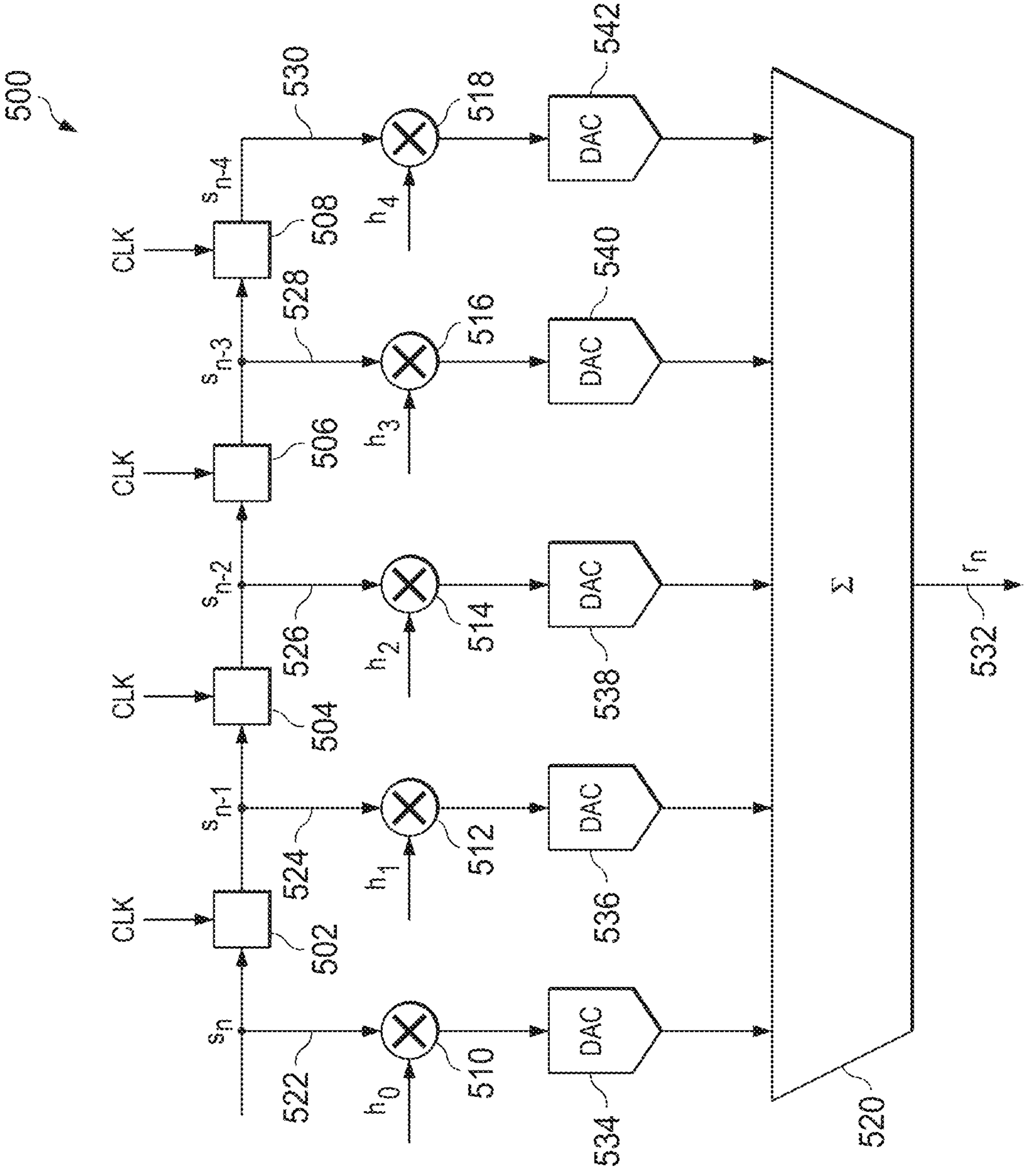

However, in some examples, the combination block 520 may be an analog combination block, meaning that the combination block 520 performs combination operations with analog signals. In such examples, the single DAC 426 (FIG. 4) is not present, and instead, multiple DACs may be included within the multi-tap filter 424, each DAC positioned between the combination block 520 and a respective multiplication block 510, 512, 514, 516, and 518. FIG. 5B depicts such an example. FIG. 5B depicts a circuit schematic diagram of a filter 500 that is identical to the filter shown in FIG. 5A, except that the filter 500 of FIG. 5B includes DACs 534, 536, 538, 540, and 542 between the combination block 520 and the multiplication blocks 510, 512, 514, 516, and 518, respectively. Reducing the number of taps in the multi-tap filter 424 decreases the number of such DACs present in the multi-tap filter 424, and because such DACs may be high-accuracy DACs, the total number of expensive, high-accuracy DACs in the multi-tap filter 424 may be reduced. The description above regarding the number of DACs, positions of DACs, and the analog or digital domain of the combination block 520 in the multi-tap filter 424 also applies to the filter 420, DACs within the filter 420, and/or the single DAC 422.

Figure 6:
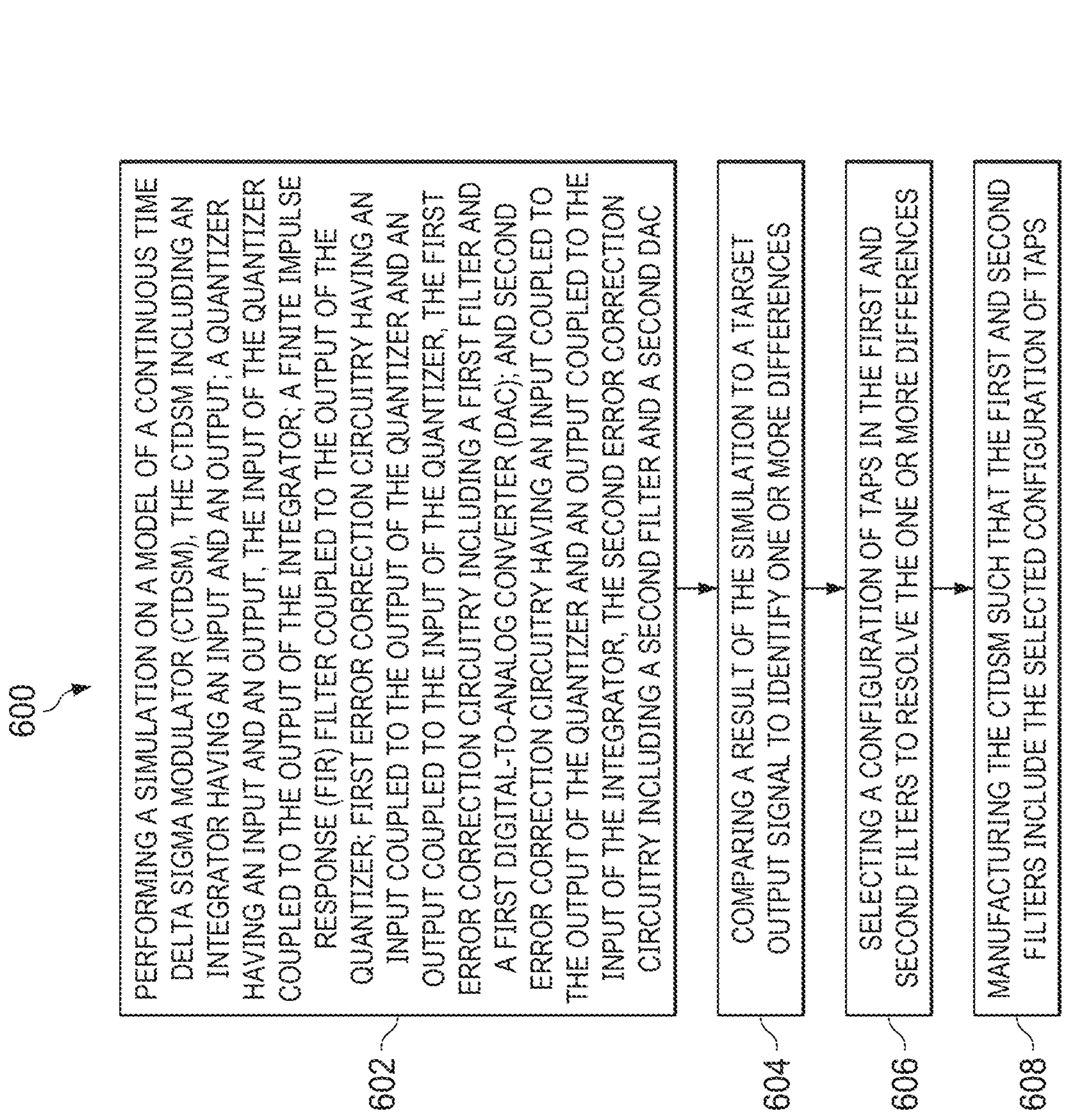
FIG. 6 is a flow diagram of a method for manufacturing a CTDSM having a high tolerance to clock frequency variation, in various examples.
Figure 7:
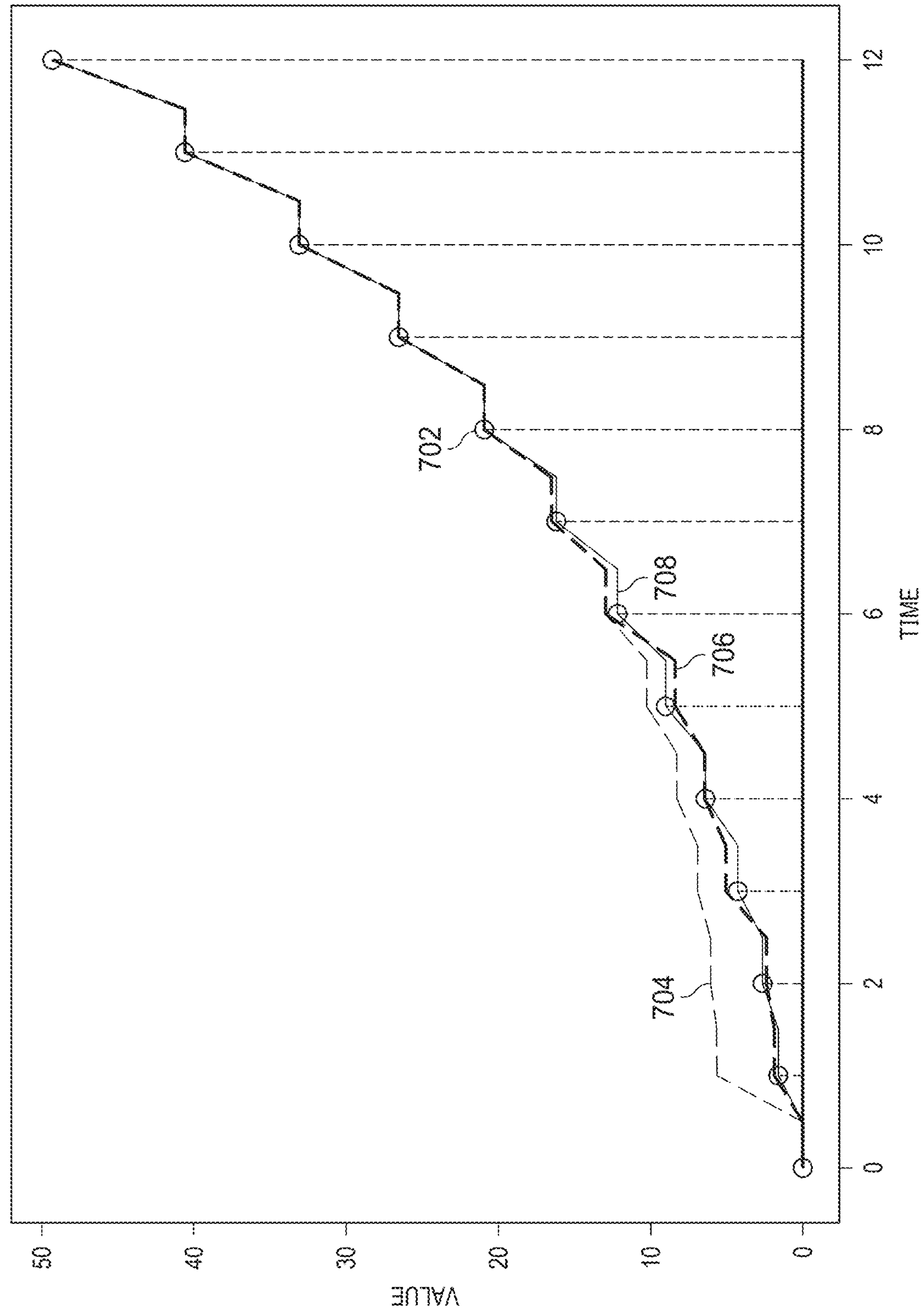
FIG. 7 is a graph depicting real and target loop filter outputs in a CTDSM with a high tolerance to clock frequency variation, in various examples.

The number of taps in each of the multi-tap filters 420, 424, 500 may be selected according to the criteria described above. FIG. 6 is a flow diagram of an example method 600 for manufacturing a CTDSM having a high tolerance to clock frequency variation, in various examples. FIG. 7 is a graph 700 depicting a technique according to which the taps in the filters may be distributed. Accordingly, the method 600 and the graph 700 are described together. The example method 600 begins with performing a simulation on a model of a CTDSM (602). The CTDSM includes an integrator having an input and an output and a quantizer having an input and an output (602). The input of the quantizer is coupled to the output of the integrator (602). The CTDSM includes a FIR filter coupled to the output of the quantizer (602). The CTDSM includes FECC having an input coupled to the output of the quantizer and an output coupled to the input of the quantizer (602). The FECC includes a first filter and a first DAC (602). The CTDSM includes SECC having an input coupled to the output of the quantizer and an output coupled to the input of the integrator (602). The SECC includes a second filter and a second DAC (602). The method 600 further includes comparing a result of the simulation to a target output signal to identify one or more differences (604). The graph 700 depicts time on the x-axis and value (e.g., output of the loop filter (e.g., loop filter 300, FIG. 3) responsive to an impulse input, meaning the impulse response of the filter) on the y-axis. The graph 700 includes discrete points 702 that define a target output signal. The target output signal may be determined by any suitable entity (e.g., software, hardware, or by human hand). Curve 704 describes the output signal of a loop filter (e.g., the loop filter 300, FIG. 3) in a simulated CTDSM (e.g., simulated in a computer using software). As shown, from time 0.5 to time 7, the simulated output of the loop filter, described by curve 704, does not match the target output signal defined by discrete points 702.

Figure 8:
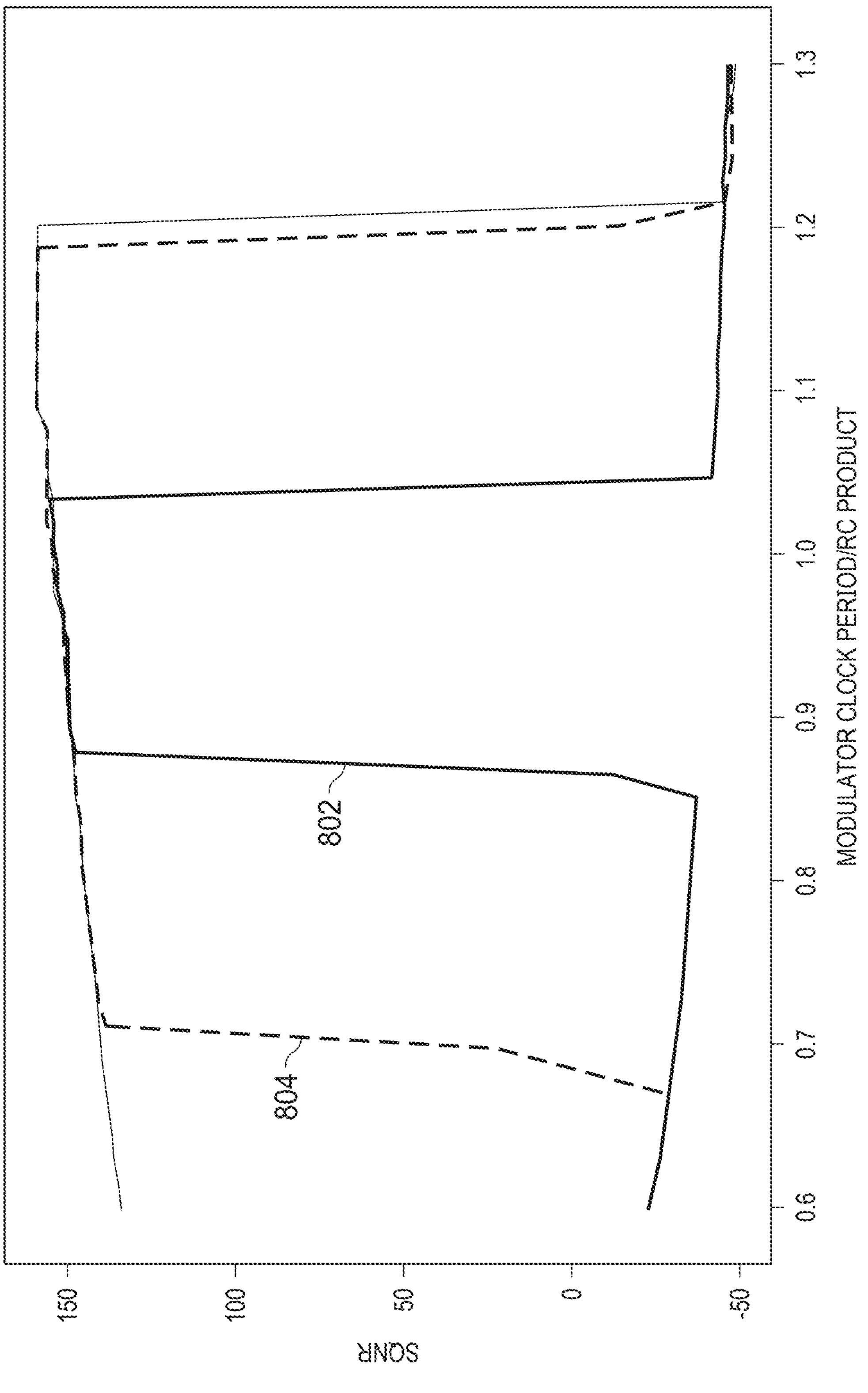
FIG. 8 is a graph depicting tolerance in clock frequency variation for a CTDSM, in various examples.

Still referring to FIG. 6, the method 600 includes selecting a configuration of taps in the first and second filters to resolve the one or more differences (606). The presence of the SECC 308 (FIG. 3), such as the multi-tap filter 424 and DAC 426 (FIG. 4), can reduce the difference present between the curve 704 and the discrete points 702. For example, the multi-tap filter 424 may be selected to have three taps, each with specific weights that together result in a loop filter output signal described by curve 706. The curve 706 demonstrates that the multi-tap filter 424 and DAC 426 reduce the difference between the actual loop filter output and the target loop filter output. The majority of this difference has been eliminated, and thus the multi-tap filter 424 and the DAC 426 are described as performing a coarse error correction. Stated another way, the multi-tap filter 424 may have a greater impact on an amplitude of an output signal of the loop filter in the CTDSM (e.g., loop filter 300, FIG. 3) than is the filter 420. However, the curve 706 does not precisely match the discrete points 702. The FECC 306 (FIG. 3), such as the filter 420 and the DAC 422 (FIG. 4), provide a finer, or more granular, error correction, eliminating or at least mitigating the residual error not already eliminated by the SECC 308. The number and weighting of the taps in the FECC 306 (e.g., the filter 420) may be selected using the modeling of graph 700 to mitigate any error remaining between the curve 706 and the discrete points 702. The curve 708 depicts the loop filter output when both the FECC 306 and the SECC 308 (FIG. 3), such as the multi-tap filters 420, 424 and DACs 422, 426 (FIG. 4) are implemented in the CTDSM. As shown, the error is eliminated or almost eliminated, while still mitigating the expense and space demands associated with a large DAC 426 and while still facilitating an increased tolerance for CLK frequency variation, as graph 800 of FIG. 8 shows. More specifically, the graph 800 depicts CLK period on the x-axis and signal-to-quantization-noise-ratio (SQNR) on the y-axis. A curve 802 shows that the absence of the SECC 308 causes the CTDSM to have poor tolerance to frequency swings. In the example graph 800, the CTDSM is able to tolerate changes in CLK period from approximately 0.85 to approximately 1.05, with CLK periods greater than 1.05 or lesser than 0.85 resulting in poor SQNR. Conversely, the SECC 308, when included in the CTDSM, provides frequency-scaled error correction. Curve 804 shows that the CTDSM tolerance to frequency variation is substantially increased, with a tolerance CLK period range from approximately 0.68 to approximately 1.22.

As described above, the number of taps in the SECC 308 (e.g., multi-tap filter 424) may be fewer than the number of taps in the FECC 307 (e.g., filter 420). In examples, the number of taps in the multi-tap filter 424 is a minimum number of taps for an output signal of the loop filter (e.g., loop filter 300, FIG. 3) to match a target output signal of a loop filter in the CTDSM, such as the discrete points 702 (FIG. 7).

Figure 9:
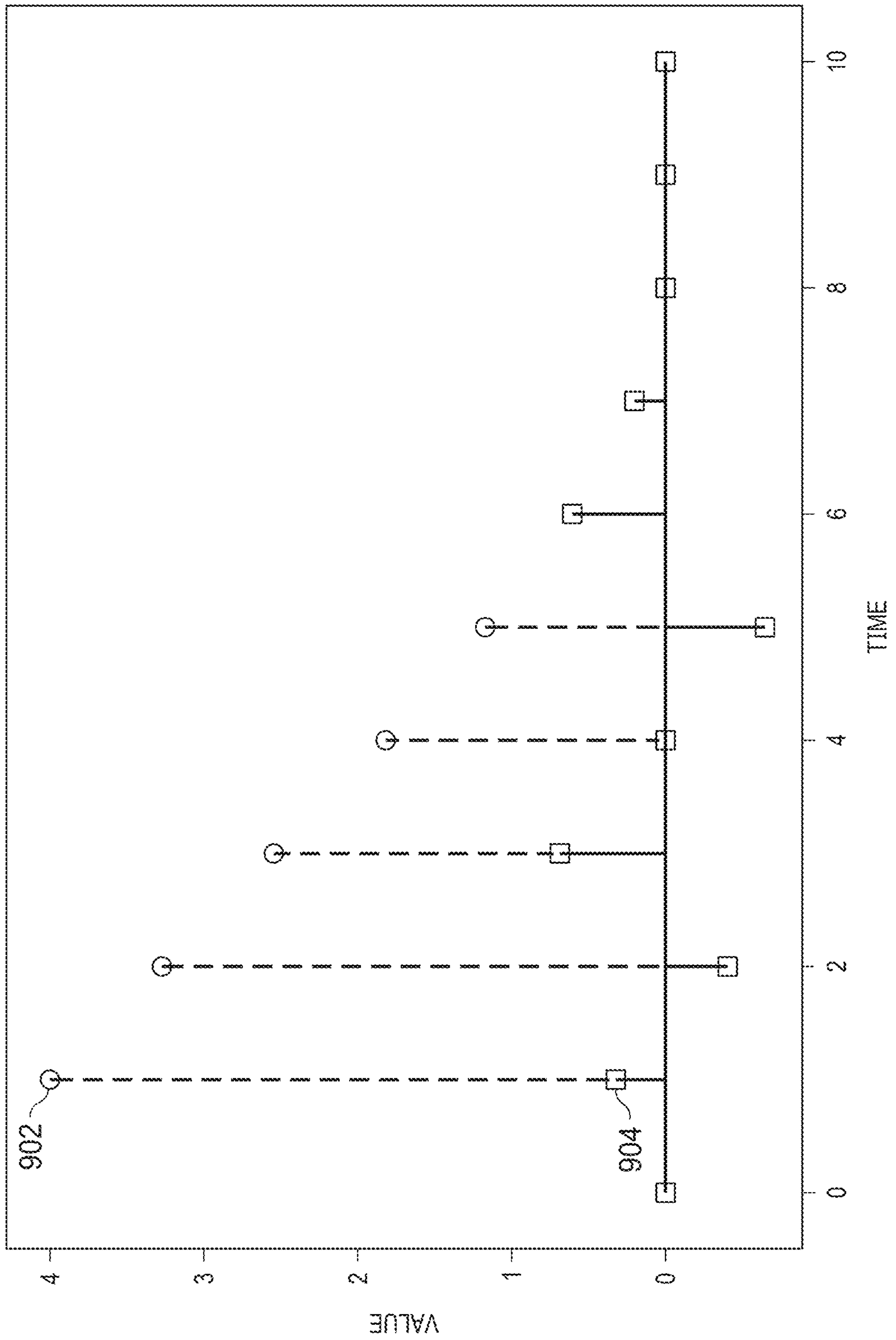
FIG. 9 is a graph depicting residual error in a CTDSM with a high tolerance to clock frequency variation, in various examples.

FIG. 9 is a graph depicting residual error in a CTDSM with a high tolerance to clock frequency variation, in various examples. Specifically, the x-axis depicts time, and the y-axis depicts value (e.g., degree of CTDSM residual error that is uncorrected). Points 902 depict the degrees of residual error remaining when the examples described herein are not implemented, such as in the case of prior solutions. In contrast, points 904 depict the degrees of residual error remaining when the example CTDSMs described herein (e.g., in FIG. 4) are implemented. As shown by the difference in residual error between points 902 and 904 for each instance in time, the SECC 308 (FIG. 3) is useful to substantially reduce the degree of residual error remaining to be corrected. As described above, the FECC 306 (FIG. 3) is useful to correct such residual error.

Still referring to FIG. 6, the method 600 includes manufacturing the CTDSM such that the first and second filters include the selected configuration of taps (608).

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

In this description, unless otherwise stated, "about," "approximately" or "substantially" preceding a parameter means being within +/−10 percent of that parameter.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device, or a semiconductor component.

Modifications are possible in the described example, and other examples are possible, within the scope of the claims.

What is claimed is:

1. A device, comprising:

a loop filter having an input and an output;

an integrator having an input and an output, the input of the integrator coupled to the output of the loop filter;

a quantizer having an input and an output, the input of the quantizer coupled to the output of the integrator;

a finite impulse response (FIR) filter having an input and an output, the input of the FIR filter coupled to the output of the quantizer, and the output of the FIR filter coupled to the input of the loop filter;

first error correction circuitry (FECC) having an input and an output, the input of the FECC coupled to the output of the quantizer, and the output of the FECC coupled to the input of the quantizer, the FECC including a first filter having a first number of taps; and second error correction circuitry (SECC) having an input and an output, the input of the SECC coupled to the output of the quantizer, and the output of the SECC coupled to the input of the integrator, the SECC including a second filter having a second number of taps greater than the first number of taps.

2. The device of claim 1, wherein the FECC includes a first digital-to-analog converter (DAC) and the SECC includes a second DAC, the first DAC coupled between the first filter and the input of the quantizer, and the second DAC coupled between the second filter and the input of the integrator.

3. The device of claim 1, wherein the second number of taps is a minimum number of taps for an output signal of the loop filter to match a target output signal.

4. The device of claim 1, wherein the loop filter includes a set of integrators having an input and an output, the input of the set of integrators coupled to a DAC, and the output of the set of integrators coupled to the input of the integrator.

5. The device of claim 4, wherein the DAC is coupled to the FIR filter.

6. The device of claim 1, wherein the SECC is configured to provide an error correction that increases and decreases responsive to changes in a clock period of a clock received by the device.

7. A device, comprising:

a continuous-time delta sigma modulator (CTDSM), including:

an integrator having an input and an output;

a quantizer having an input and an output, the input of the quantizer coupled to the output of the integrator;

a first filter having one or more taps, an input, and an output, the input of the first filter coupled to the output of the quantizer;

a first digital-to-analog converter (DAC) having an input and an output, the input of the first DAC coupled to the output of the first filter, and the output of the first DAC coupled to the input of the quantizer;

a second filter having one or more taps, an input, and an output, the input of the second filter coupled to the output of the quantizer;

a second DAC having an input and an output, the input of the second DAC coupled to the output of the second filter, and the output of the second DAC coupled to the input of the integrator; and a third filter having an input coupled to the output of the quantizer;

a digital signal processor (DSP) coupled to the CTDSM;

a third DAC coupled to the DSP; and a speaker coupled to the DAC.

8. The device of claim 7, wherein the third filter is a finite impulse response (FIR) filter.

9. The device of claim 7, wherein the second filter is a comb filter.

10. The device of claim 7, wherein the second filter has fewer taps than does the first filter.

11. The device of claim 7, wherein the second filter and the second DAC are configured to provide an error correction that increases and decreases responsive to changes in a clock period of a clock received by the CTDSM.

12. The device of claim 7, further comprising a combination block having an output and multiple inputs, the output of the combination block coupled to the input of the integrator, and the multiple inputs of the combination block coupled to the output of the first DAC and to outputs of each of a set of serially-coupled integrators in the CTDSM.

13. A continuous-time delta sigma modulator (CTDSM), comprising:

a first combination block having an input and an output;

a first integrator having an input and an output, the input of the first integrator coupled to the output of the first combination block;

a second combination block having first and second inputs and an output, the first input of the second combination block coupled to the output of the first integrator;

a second integrator having an input and an output, the input of the second integrator coupled to the output of the second combination block;

a third combination block having first and second inputs and an output, the first input of the third combination block coupled to the output of the second integrator;

a quantizer having an input and an output, the input of the quantizer coupled to the output of the third combination block;

a multi-tap finite impulse response (FIR) filter having an input and an output, the input of the FIR filter coupled to the output of the quantizer;

a first digital-to-analog converter (DAC) having an input and an output, the input of the first DAC coupled to the output of the FIR filter, and the output of the first DAC coupled to the input of the first combination block;

a first filter including one or more taps, an input, and an output, the input of the first filter coupled to the output of the quantizer;

a second DAC having an input and an output, the input of the second DAC coupled to the output of the first filter, and the output of the second DAC coupled to the second input of the second combination block;

a second filter including one or more taps, an input, and an output, the input of the second filter coupled to the output of the quantizer; and a third DAC having an input and an output, the input of the third DAC coupled to the output of the second filter, and the output of the third DAC coupled to the second input of the third combination block.

14. The CTDSM of claim 13, wherein the first filter includes a minimum number of taps for an output signal of a loop filter in the CTDSM to match a target output signal of the loop filter.

15. The CTDSM of claim 13, wherein the first filter includes fewer taps than does the second filter.

16. The CTDSM of claim 13, wherein the first filter is a comb filter.

17. The CTDSM of claim 13, wherein the first filter is configured to have a greater impact on an amplitude of an output signal of a loop filter in the CTDSM than is the second filter.

18. The CTDSM of claim 13, wherein the third DAC is a most significant bit (MSB) DAC.

19. The CTDSM of claim 13, wherein the second combination block is configured to receive:

an output signal from the first integrator, and an input signal provided to the CTDSM.

20. The CTDSM of claim 13, wherein the first filter and the second DAC are configured to provide an error correction that increases and decreases responsive to changes in a clock period of a clock received by the CTDSM.

* * * * *